United States Patent
Watari

(10) Patent No.: US 11,662,483 B2
(45) Date of Patent: May 30, 2023

(54) SIGNAL READOUT CIRCUIT, SIGNAL READOUT DEVICE, AND SIGNAL READOUT METHOD FOR PHOTODETECTION ELEMENT

(71) Applicant: HAMAMATSU PHOTONICS K.K., Hamamatsu (JP)

(72) Inventor: Takeshi Watari, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 17/625,894

(22) PCT Filed: Jul. 6, 2020

(86) PCT No.: PCT/JP2020/026468
§ 371 (c)(1),
(2) Date: Jan. 10, 2022

(87) PCT Pub. No.: WO2021/010218
PCT Pub. Date: Jan. 21, 2021

(65) Prior Publication Data
US 2022/0268948 A1    Aug. 25, 2022

(30) Foreign Application Priority Data
Jul. 18, 2019    (JP) .............................. JP2019-132677

(51) Int. Cl.
*G01J 1/42*    (2006.01)
*G01T 1/164*    (2006.01)
(Continued)

(52) U.S. Cl.
CPC ............ *G01T 1/20184* (2020.05); *G01J 1/42* (2013.01); *G01T 1/1644* (2013.01);
(Continued)

(58) Field of Classification Search
CPC ...... G01J 1/42; G01T 1/1644; G01T 1/20184; G01T 1/2019; G01T 7/00; H01L 31/10; H04N 5/32; H04N 25/75; H04N 25/77
See application file for complete search history.

(56) References Cited

U.S. PATENT DOCUMENTS

2005/0219388 A1\*    10/2005    Hornig .................... H04N 5/32
348/E5.079

FOREIGN PATENT DOCUMENTS

| JP | H05-187914 A | 7/1993 |
| JP | H06-347557 A | 12/1994 |

(Continued)

OTHER PUBLICATIONS

Goertzen, Andrew L. et al., "Design and Performance of a Resistor Multiplexing Readout Circuit for a SiPM Detector," IEEE Transactions on Nuclear Science, vol. 60, No. 3, 2013, pp. 1541-1549.

(Continued)

*Primary Examiner* — Mark R Gaworecki
(74) *Attorney, Agent, or Firm* — Faegre Drinker Biddle & Reath LLP

(57) ABSTRACT

A signal readout circuit is a circuit for reading out a signal from a photodetection element having a plurality of photodetection pixels each generating a detection signal according to light incidence, and includes N light incidence detection units (N is an integer of 2 or more) each for inputting the detection signal from each of N photodetection pixels and outputting a signal indicating the light incidence, and a total value detection unit for detecting a total value of the output signals from the N light incidence detection units. Each light incidence detection unit outputs the signal weighted differently corresponding to each photodetection pixel. A weight thereof is set such that the total values are different for (Continued)

respective photodetection pixels and all combination patterns of the photodetection pixels.

6 Claims, 15 Drawing Sheets

(51) Int. Cl.
  *G01T 1/20*    (2006.01)
  *H04N 5/32*    (2023.01)
  *H04N 25/75*   (2023.01)
  *H04N 25/77*   (2023.01)
(52) U.S. Cl.
  CPC ............ *G01T 1/2019* (2020.05); *H04N 5/32* (2013.01); *H04N 25/75* (2023.01); *H04N 25/77* (2023.01)

(56) References Cited

FOREIGN PATENT DOCUMENTS

| JP | H07-311270 A | 11/1995 |
| JP | 2003-287404 A | 10/2003 |
| JP | 2010-169516 A | 8/2010 |

OTHER PUBLICATIONS

Popov, Vladimir et al., "A novel readout concept for multianode photomultiplier tubes with pad matrix anode layout," Nuclear Instruments and Methods in Physics Research, A 567, 2006, p. p319-322.

International Preliminary Report on Patentability dated Jan. 27, 2022 for PCT/JP2020/026468.

* cited by examiner

*Fig.7*
(a)
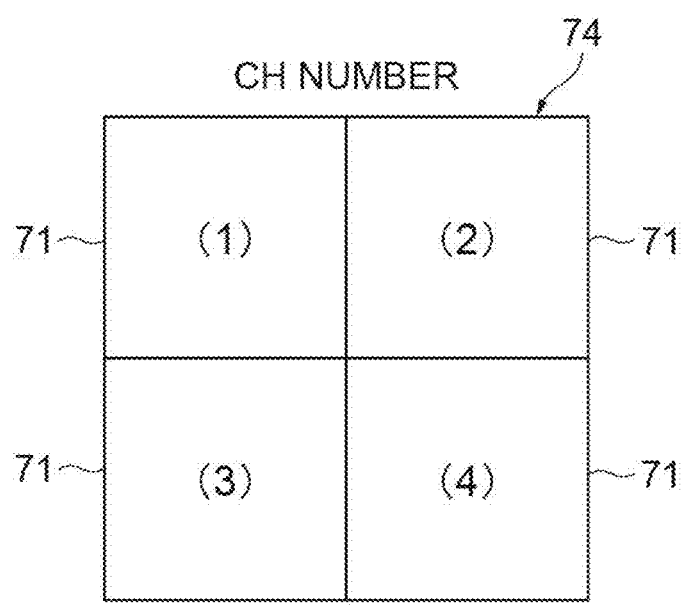
(b)
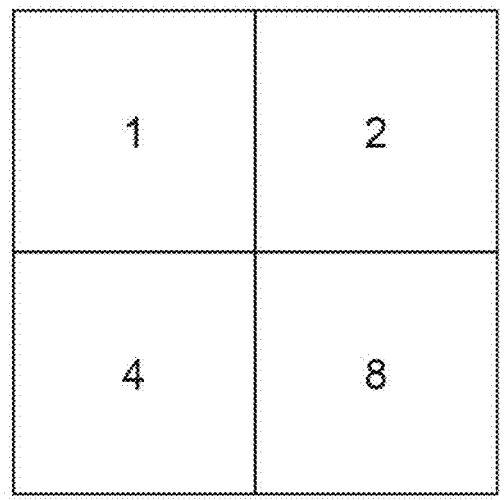

Fig.8

| TOTAL VALUE | DETECTION CH |
|---|---|
| 0 | none |
| 1 | (1) |
| 2 | (2) |
| 3 | (1)+(2) |
| 4 | (3) |
| 5 | (1)+(3) |
| 6 | (2)+(3) |
| 7 | (1)+(2)+(3) |
| 8 | (4) |
| 9 | (1)+(4) |
| 10 | (2)+(4) |
| 11 | (1)+(2)+(4) |
| 12 | (3)+(4) |
| 13 | (1)+(3)+(4) |
| 14 | (2)+(3)+(4) |
| 15 | all CHs |

SIGNAL READOUT CIRCUIT, SIGNAL READOUT DEVICE, AND SIGNAL READOUT METHOD FOR PHOTODETECTION ELEMENT

TECHNICAL FIELD

The present disclosure relates to a signal readout circuit, a signal readout apparatus, and a signal readout method for a photodetection element.

BACKGROUND ART

Patent Document 1 discloses a technique related to a radiation detector. The above radiation detector includes a scintillator group including a plurality of two-dimensionally coupled scintillators and an optical sensor optically coupled to the scintillator group, and detects an incident position of a gamma ray incident on the scintillator group. The scintillator group is constituted by bringing the scintillators into close contact with or close to each other. A plurality of photosensors are optically coupled to the scintillator group, and the incident position of the gamma ray is detected by obtaining a centroid of a light amount distribution based on a detected light amount detected by each photosensor.

CITATION LIST

Patent Literature

Patent Document 1: Japanese Patent Application Laid-Open Publication No. H7-311270

Non Patent Literature

Non Patent Document 1: Andrew L. Goertzen et al., "Design and Performance of a Resistor Multiplexing Readout Circuit for a SiPM Detector", IEEE Transactions on Nuclear Science, Vol. 60 No. 3, pp. 1541-1549 (2013)
Non Patent Document 2: Vladimir Popov et al., "A novel readout concept for multianode photomultiplier tubes with pad matrix anode layout", Nuclear Instruments and Methods in Physics Research, A 567, pp. 319-322 (2006)

SUMMARY OF INVENTION

Technical Problem

For example, when a signal is read out from a multi-channel type photodetection element such as a multi-pixel photon counter (MPPC) and a multi-anode photomultiplier tube (PMT), the most widely used configuration is a configuration using a resistor chain. FIG. 14 conceptually illustrates a configuration of a radiation detector using a resistor chain as an example. The radiation detector 100 includes a scintillator group 101 including a plurality of scintillators 102 arrayed one-dimensionally or two-dimensionally, and a multi-channel type photodetection element 103 attached to the scintillator group 101.

Respective photodetection pixels (channels) 104 of the photodetection element 103 are electrically connected to each other via a resistor chain 105 including a plurality of resistors 106 connecting the adjacent photodetection pixels 104. In the radiation detector 100, signals are read out from both ends of the resistor chain 105, and an incident position of light (that is, an incident position of radiation) is determined based on the magnitudes of the signals. The above configuration is often used particularly for readout of a signal from a multi-anode PMT, and is widely used in positron emission tomography (PET), radiation measurement devices, and the like.

However, the above resistor chain configuration has the following problems. That is, since signal processing for determining the incident position of the light requires several 10 to several 100 microseconds, the signal processing speed slows down the response speed of the entire apparatus although the response speed of the detection element itself is relatively fast (for example, 100 nanoseconds or less). Further, when the light is simultaneously incident on a plurality of positions, the incident position information is lost because the light cannot be distinguished and detected.

For the above problems of the resistor chain configuration, a configuration may be considered in which the readout circuits of the number same as the photodetection pixels 104 are provided, and the output signals from the respective photodetection pixels 104 are individually read out (see FIG. 15). However, in such a configuration, the scale of the readout circuit is increased according to the number of the photodetection pixels 104, and the circuit scale is enormous for the number of the photodetection pixels of, for example, 64 or 256.

An object of an embodiment is to provide a signal readout circuit, a signal readout apparatus, and a signal readout method for a photodetection element capable of distinguishing and detecting light even when the light is simultaneously incident on a plurality of positions while suppressing an increase in circuit scale.

Solution to Problem

An embodiment is a signal readout circuit for a photodetection element. The signal readout circuit for the photodetection element is a circuit for reading out a signal from the photodetection element having a plurality of photodetection pixels each generating a detection signal according to light incidence, and includes N light incidence detection units (N is an integer of 2 or more) each for inputting the detection signal from each of N photodetection pixels included in the plurality of photodetection pixels and outputting a signal indicating the light incidence; and a total value detection unit for detecting a total value of the output signals from the N light incidence detection units, and each light incidence detection unit outputs the signal weighted differently corresponding to each photodetection pixel, and a weight thereof is set such that the total values are different for respective photodetection pixels and all combination patterns of the photodetection pixels in the N photodetection pixels.

An embodiment is a signal readout method for a photodetection element. The signal readout method for the photodetection element is a method for reading out a signal from the photodetection element having a plurality of photodetection pixels each generating a detection signal according to light incidence, and includes a first step of generating N signals (N is an integer of 2 or more) each indicating the light incidence based on a signal from each of N photodetection pixels included in the plurality of photodetection pixels; and a second step of detecting a total value of the N signals, and in the first step, the signal weighted differently corresponding to each photodetection pixel is generated, and a weight thereof is set such that the total values are different for respective photodetection pixels and all combination patterns of the photodetection pixels in the N photodetection pixels.

In the signal readout circuit and the signal readout method described above, when the signal indicating the light incidence is generated in the light incidence detection unit (first step), a different weight is applied corresponding to each photodetection pixel, and the total value of the N weighted signals is detected in the total value detection unit (second step). The weights are set such that the total values are different for the respective photodetection pixels and all the combination patterns of the photodetection pixels.

In the above configuration, it is possible to uniquely determine (one or a plurality of) photodetection pixels on which the light is incident from the total value. Therefore, according to the above signal readout circuit and the signal readout method, it is possible to distinguish and detect the light even when the light is simultaneously incident on a plurality of positions. Further, it is possible to suppress an increase in circuit scale compared to the case where N signal readout circuits corresponding to N photodetection pixels are provided.

An embodiment is a signal readout apparatus for a photodetection element. The signal readout apparatus for the photodetection element is an apparatus for reading out a signal from the photodetection element having M photodetection pixel groups (M is an integer of 2 or more) each including a plurality of photodetection pixels each generating a detection signal according to light incidence, and includes M signal readout circuits each being the signal readout circuit for the photodetection element of the above configuration, and each of the M signal readout circuits reads out the signal from each of the M photodetection pixel groups.

According to the above signal readout apparatus, by applying the signal readout circuit of the above configuration as the M signal readout circuits, it is possible to distinguish and detect the light even when the light is simultaneously incident on a plurality of positions while suppressing an increase in circuit scale. Further, by dividing a large number of photodetection pixels of the photodetection element into the M photodetection pixel groups and providing the signal readout circuit for each photodetection pixel group, the number N of the light incidence detection units can be reduced compared to the case of using the single signal readout circuit. Therefore, the number of all the combination patterns realized by the N photodetection pixels can be prevented from becoming too large.

Advantageous Effects of Invention

According to the signal readout circuit, the signal readout apparatus, and the signal readout method for the photodetection element of the embodiments, it is possible to distinguish and detect the light even when the light is simultaneously incident on a plurality of positions while suppressing an increase in circuit scale.

BRIEF DESCRIPTION OF DRAWINGS

FIG. 7 includes (a) a diagram illustrating one photodetection pixel group 74, and (b) a diagram illustrating an example of weight values of light incidence detection units 13 respectively corresponding to four photodetection pixels 71 illustrated in (a).

FIG. 8 is a table showing a relationship between a total value of output signals from the N light incidence detection units 13 detected by a total value detection unit 14 and a combination of channel numbers.

DESCRIPTION OF EMBODIMENTS

Hereinafter, embodiments of a signal readout circuit, a signal readout apparatus, and a signal readout method for a photodetection element will be described in detail with reference to the accompanying drawings. In the description of the drawings, the same elements will be denoted by the same reference signs, and redundant description will be omitted.

Figure 1:
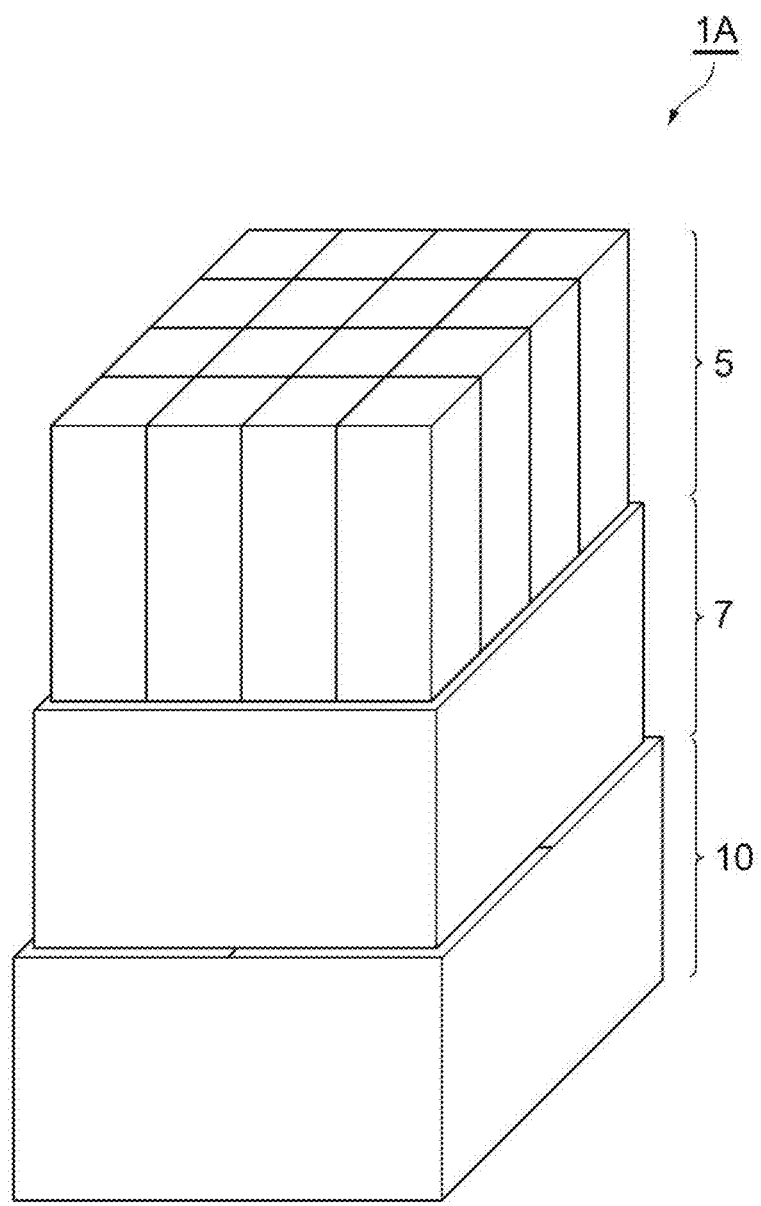
FIG. 1 is a perspective view illustrating an appearance of a radiation detector 1A according to an embodiment.

FIG. 1 is a perspective view illustrating an appearance of a radiation detector 1A according to an embodiment. The radiation detector 1A includes a scintillator array 5, a photodetection element 7, and a signal readout apparatus 10. The scintillator array 5 is disposed on one end face (light incident surface) of the photodetection element 7. The signal readout apparatus 10 is disposed on the other end face (signal output surface) of the photodetection element 7. In other words, in an incident direction of radiation, the photodetection element 7 is disposed between the scintillator array 5 and the signal readout apparatus 10.

Figure 2:
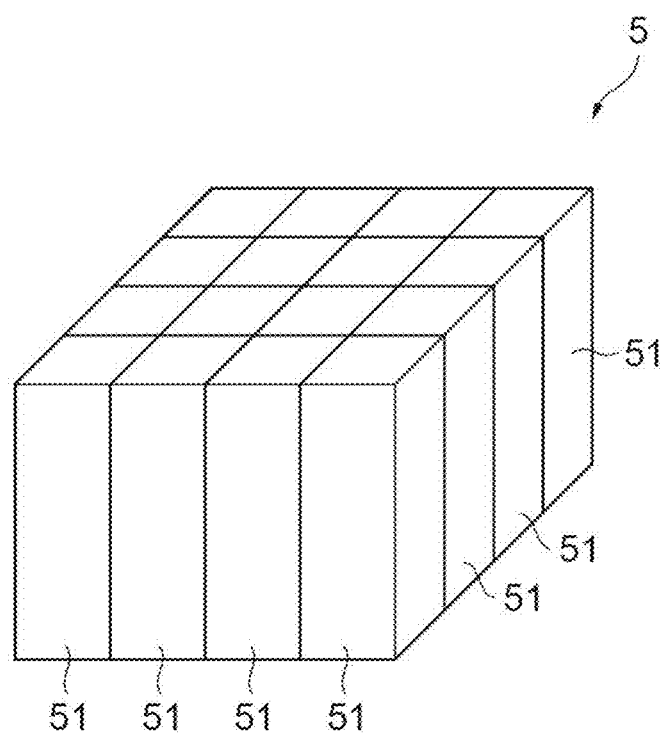
FIG. 2 is a perspective view illustrating an appearance of a scintillator array 5.

FIG. 2 is a perspective view illustrating an appearance of the scintillator array 5. The scintillator array 5 includes L scintillators 51 (L is an integer of 2 or more, and L=16 in the case illustrated in the figure). The L scintillators 51 each having a rectangular parallelepiped outer shape are arranged one-dimensionally or two-dimensionally. In the illustrated example, the 16 scintillators 51 are arrayed two-dimensionally in 4 rows×4 columns.

Each scintillator 51 generates photons when the radiation is incident thereon. A light-shielding wall is provided between the scintillators 51 adjacent to each other, and at least a part of the photons generated in the scintillator 51 moves to the surface opposite to the surface on which the radiation is incident without moving to the other adjacent scintillator 51. In addition, examples of a material of the scintillator 51 include plastic.

Figure 3:
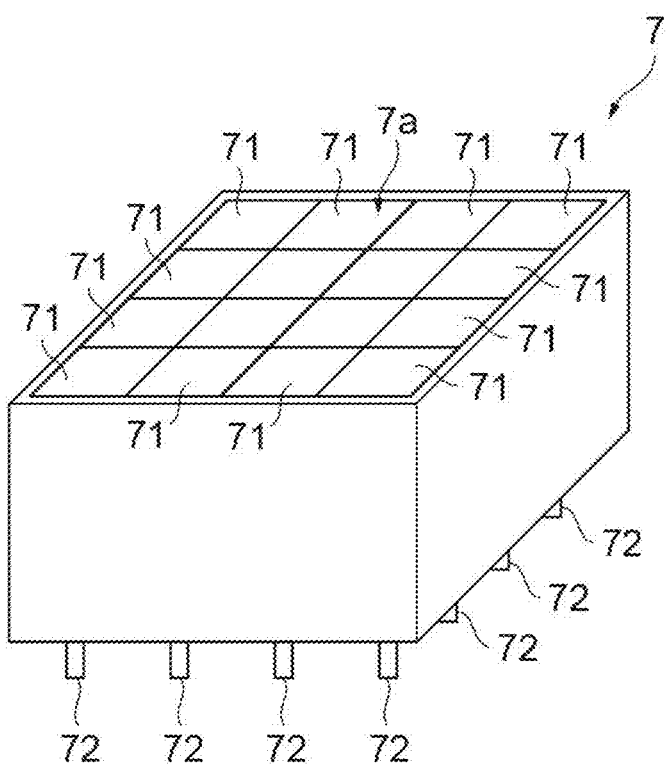
FIG. 3 is a perspective view illustrating an appearance of a photodetection element 7.

FIG. 3 is a perspective view illustrating an appearance of the photodetection element 7. The photodetection element 7 is, for example, a multi-channel type photodetection element such as an MPPC and a multi-anode PMT, and is, for example in the case of the MPPC, mainly formed of a semiconductor material such as silicon. The photodetection element 7 has L photodetection pixels 71 in the light incident surface 7a. The L photodetection pixels 71 are arrayed one-dimensionally or two-dimensionally corresponding to the array of the scintillators 51 in the scintillator array 5.

That is, the respective photodetection pixels 71 correspond to the respective scintillators 51 in one-to-one correspondence, and face the respective scintillators 51. In the illustrated example, the 16 photodetection pixels 71 are arrayed two-dimensionally in 4 rows×4 columns. Further, the photodetection element 7 further includes L output terminals 72. The respective output terminals 72 protrude from the signal output surface 7b opposite to the light incident surface 7a, and are provided in one-to-one correspondence with the respective photodetection pixels 71.

Each of the L photodetection pixels 71 generates a detection signal according to the incidence of photons from the scintillator 51. Each photodetection pixel 71 includes, for example, an avalanche photodiode (APD) operating in Geiger mode and a quenching resistor connected in series to the APD. The quenching resistor is electrically connected to the output terminal 72. The detection signal generated in each photodetection pixel 71 is output from the output terminal 72 to the outside of the photodetection element 7.

Figure 4:
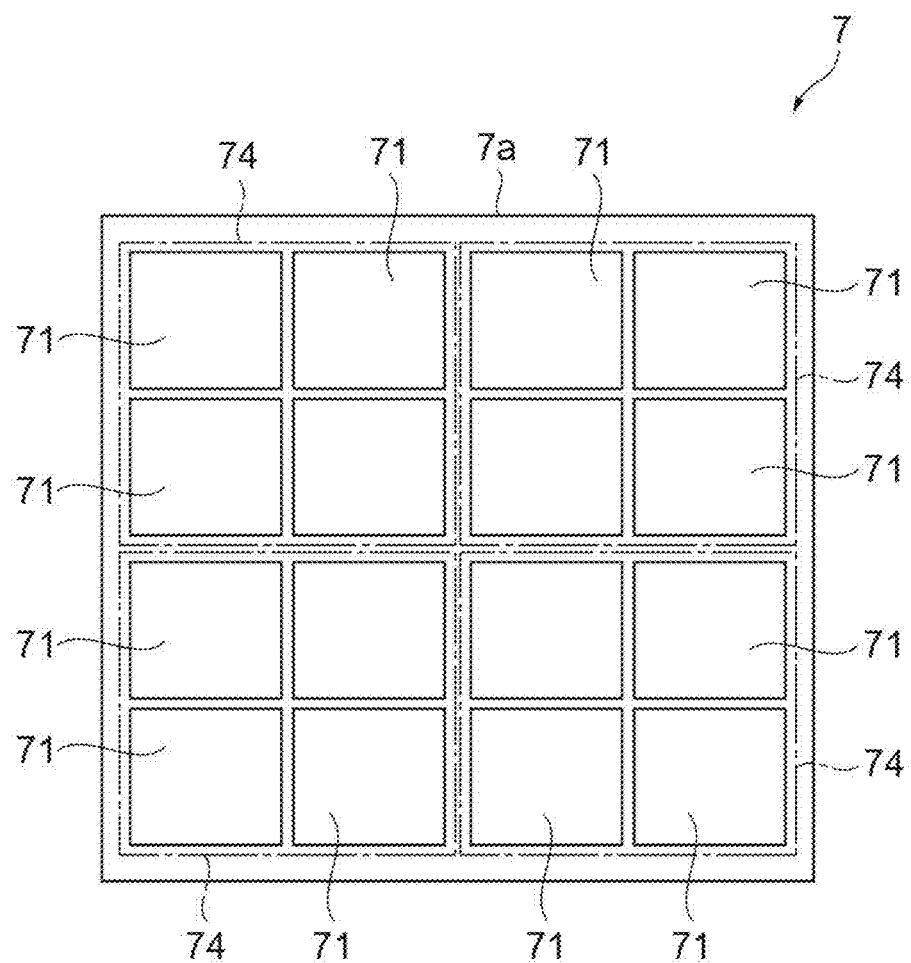
FIG. 4 is a plan view illustrating a light incident surface 7a of the photodetection element 7.

FIG. 4 is a plan view illustrating the light incident surface 7a of the photodetection element 7. In the present embodiment, the L photodetection pixels 71 are divided into M photodetection pixel groups 74 (M is an integer of 2 or more) each including N photodetection pixels 71. In the illustrated example, the 16 photodetection pixels 71 are equally divided into the 4 photodetection pixel groups 74. In this case, the number N of the photodetection pixels 71 included in each photodetection pixel group 74 is 4. Further, in the case of the illustrated example, the adjacent photodetection pixels 71 of $N_1$ rows×$N_2$ columns ($N_1$ and $N_2$ are each an integer of 1 or more, and $N_1 \times N_2 = N$) are divided into one photodetection pixel group 74, and the number of rows $N_1$ and the number of columns $N_2$ are equal to each other (specifically, $N_1 = N_2 = 2$).

In addition, the number M of the photodetection pixel groups 74 is not limited to 4, and for example, may be various numbers such as M=2 and M=6. Similarly, the number N of the photodetection pixels 71 included in the photodetection pixel group 74 is not limited to 4, and for example, may be various numbers such as N=2 and N=6. The number of rows $N_1$ and the number of columns $N_2$ are also arbitrary.

Figure 5:
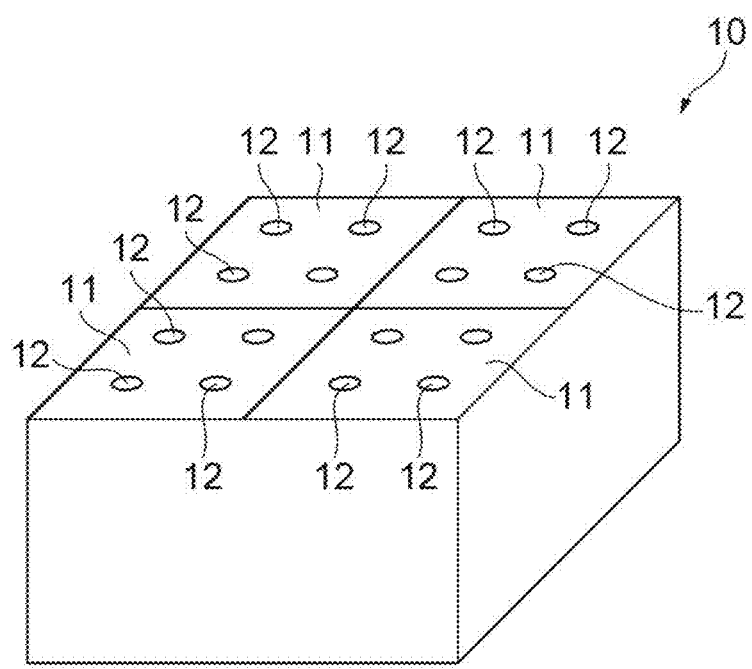
FIG. 5 is a perspective view illustrating an appearance of a signal readout apparatus 10.

FIG. 5 is a perspective view illustrating an appearance of the signal readout apparatus 10. The signal readout apparatus 10 includes M signal readout circuits 11. The M signal readout circuits 11 are arrayed one-dimensionally or two-dimensionally corresponding to the array of the photodetection pixel groups 74 in the photodetection element 7.

That is, the respective signal readout circuits 11 correspond to the photodetection pixel groups 74 in one-to-one correspondence. Each signal readout circuit 11 has N input terminals 12 connected to the N output terminals 72 of the corresponding photodetection pixel group 74. In the illustrated example, the number M of the signal readout circuits 11 is 4, and the number N of the input terminals 12 is 4.

Figure 6:
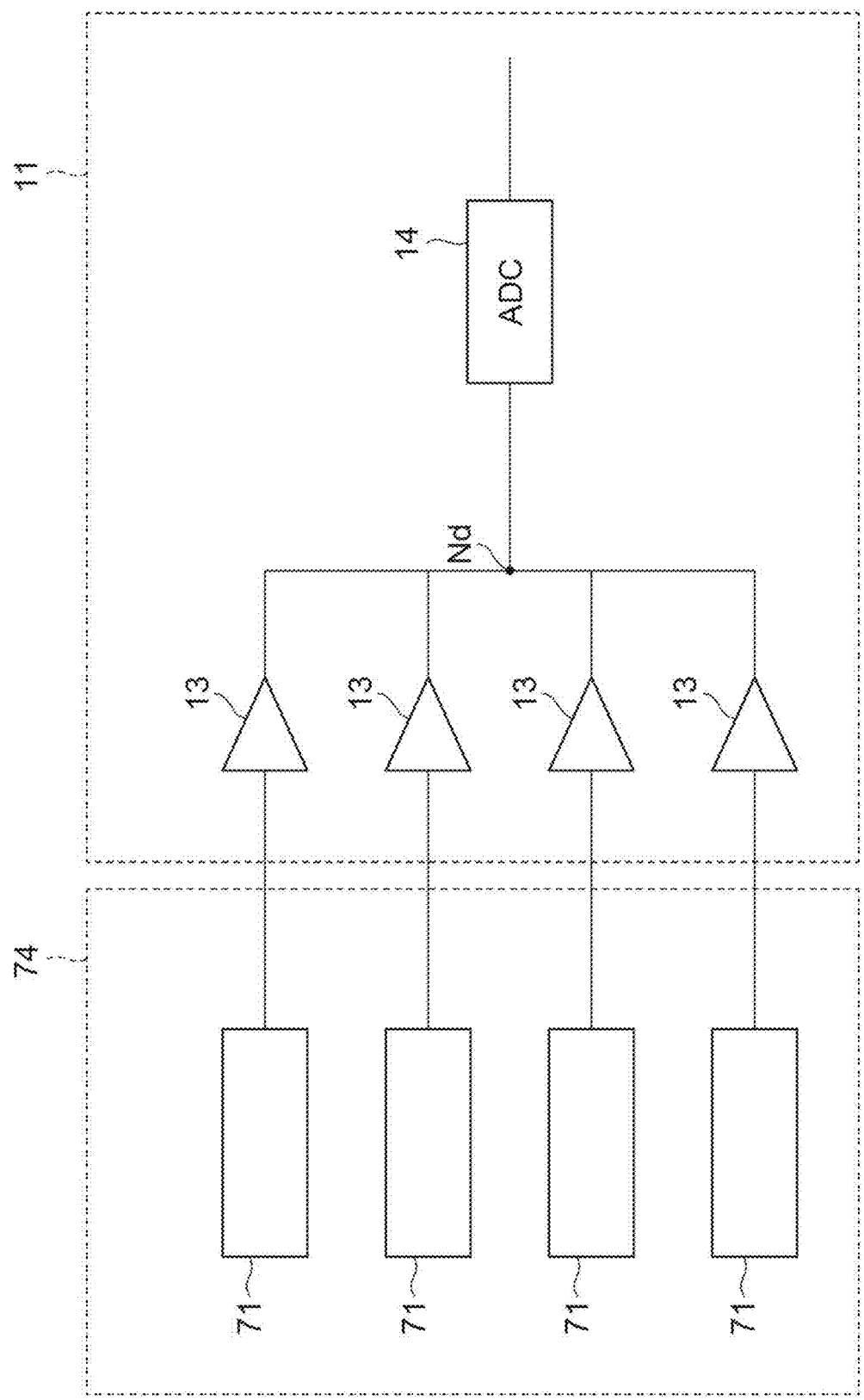
FIG. 6 is a diagram schematically illustrating an internal configuration of a signal readout circuit 11.

FIG. 6 is a diagram schematically illustrating an internal configuration of the signal readout circuit 11. The signal readout circuit 11 includes N light incidence detection units 13 and one total value detection unit 14. Each of the N light incidence detection units 13 is provided corresponding to each of the N photodetection pixels 71, and is electrically connected to the corresponding photodetection pixel 71 via the output terminal 72 and the input terminal 12. That is, each light incidence detection unit 13 is connected to the corresponding photodetection pixel 71 via a wiring line having a resistance value of substantially zero.

Each light incidence detection unit 13 inputs the detection signal from the corresponding photodetection pixel 71 and outputs a signal indicating the incidence of photons on the photodetection pixel 71. The signal indicating the incidence of photons is, for example, a pulse signal having a rectangular temporal waveform. In one example, the light incidence detection unit 13 includes a comparator. When the detection signal from the photodetection pixel 71 exceeds a predetermined threshold value, the comparator outputs the pulse signal of a preset magnitude.

In the above configuration, "the pulse signal of the preset magnitude" is a signal weighted differently for each light incidence detection unit 13, and has a magnitude different for each light incidence detection unit 13. In one example, the comparator of each light incidence detection unit 13 generates the pulse signal of a certain constant magnitude when the incidence of photons is detected. Further, the comparator of each light incidence detection unit 13 converts the pulse signal into the pulse signal having the magnitude different for each light incidence detection unit 13 according to the weight determined for each light incidence detection unit 13.

The total value detection unit 14 is electrically connected to the N light incidence detection units 13 via signal transmission lines with substantially zero impedance, and detects the total value of the output signals from the N light incidence detection units 13. For equalizing the signal transmission time from each light incidence detection unit 13 to the total value detection unit 14, the line lengths between the total value detection unit 14 and the N light incidence detection units 13 are equal to each other. Further, the signal transmission lines from the N light incidence detection units 13 are combined into one at a node Nd, and then reach the total value detection unit 14.

In one example, the output signals from the N light incidence detection units 13 are analog signals, and the total value detection unit 14 includes an analog-digital converter circuit. In this case, the total value detection unit 14 converts a signal obtained by superimposing the output signals from the N light incidence detection units 13 into a digital signal. That is, when a certain light incidence detection unit 13 outputs the signal of $V_1(V)$ and another light incidence detection unit 13 outputs the signal of $V_2(V)$, the total value detection unit 14 converts the signal of $V_1+V_2(V)$ into the digital signal. The digital signal output from the total value detection unit 14 is output to the outside of the radiation detector 1A.

The N light incidence detection units 13 will be described in more detail. (a) in FIG. 7 is a diagram illustrating one photodetection pixel group 74. In this example, the 4 photodetection pixels 71 of 2 rows×2 columns are illustrated. Channel (CH) numbers (1) to (4) are assigned to these photodetection pixels 71 for convenience. Further, each light incidence detection unit 13 outputs the signal weighted by the weight different corresponding to each photodetection pixel 71.

(b) in FIG. 7 illustrates an example of the weight values of the light incidence detection units 13 respectively corresponding to the 4 photodetection pixels 71 illustrated in (a) in FIG. 7. In this example, the weight 1 is applied to the channel number (1), the weight 2 is applied to the channel number (2), the weight 4 is applied to the channel number (3), and the weight 8 is applied to the channel number (4). In other words, the weight value of the light incidence detection unit 13 having the n-th channel number (n=1, 2, ..., N) is set to $2^{(n-1)}$.

The weight of each light incidence detection unit 13 can be realized, for example, by adjusting the voltage supplied to the comparator to the magnitude according to the weight by resistive division or the like. The minimum resolution required for the total value detection unit 14 is defined by the number N of the light incidence detection units 13 connected to the total value detection unit 14. For example, when N=4, the minimum resolution required for the total value detection unit 14 is 4 bits.

FIG. 8 is a table showing a relationship between the total value of the output signals from the N light incidence detection units 13 detected by the total value detection unit 14 and the combination of the channel numbers. For example, the total value of 0 indicates that no photon is incident on any photodetection pixel 71. The total value of 1 indicates that the photon is incident only on the photodetection pixel 71 of the channel number (1). The total value of 2 indicates that the photon is incident only on the photodetection pixel 71 of the channel number (2). The total value of 3 indicates that the photons are simultaneously incident on the two photodetection pixels 71 of the channel numbers (1) and (2).

Thus, the total values for the respective photodetection pixels 71 and all the combination patterns of the photodetection pixels 71 in the N photodetection pixels 71 are different from each other and the total values do not overlap.

Figure 9:
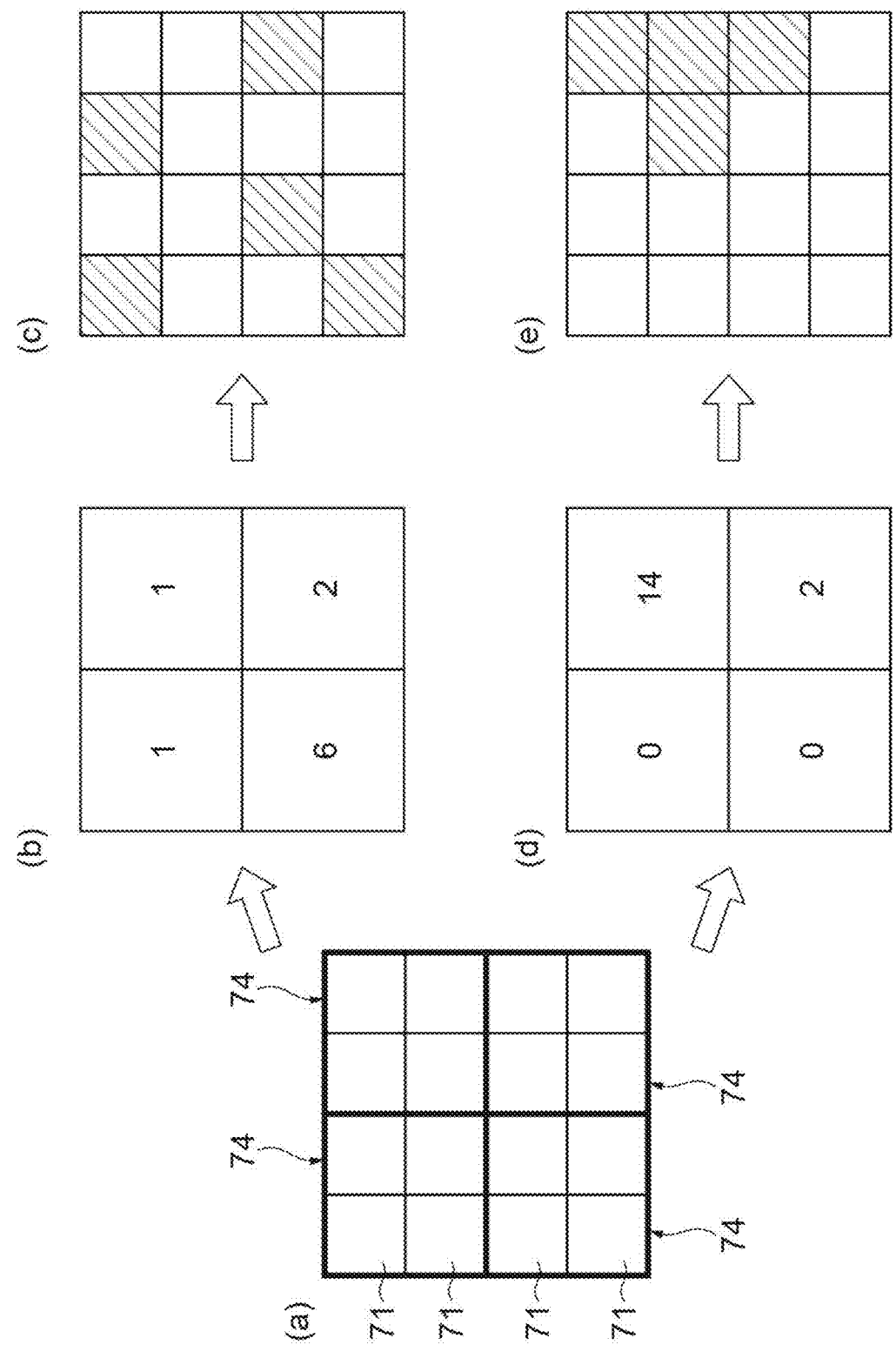
FIG. 9 includes (a)-(e) diagrams conceptually illustrating an example of determining the photodetection pixel 71 of the photodetection element 7 on which a photon is incident.

FIG. 9 includes diagrams conceptually illustrating an example of determining the photodetection pixel 71 in the photodetection element 7 on which the photons are incident. (a) in FIG. 9 illustrates the 4 photodetection pixel groups 74 each including the photodetection pixels 71 of 2 rows×2 columns (4 in total).

For example, as illustrated in (b) in FIG. 9, it is assumed that the 4 signal readout circuits 11 respectively corresponding to the 4 photodetection pixel groups 74 output the total values of 1, 1, 6, 2. In this case, in each of the two photodetection pixel groups 74 in which the total value is 1, as illustrated in (c) in FIG. 9, it is determined that the photons are incident only on the photodetection pixel 71 of the channel number (1) (the photodetection pixel 71 on which it is determined that the photons are incident is indicated with hatching). In the photodetection pixel group 74 in which the total value is 6, it is determined that the photons are simultaneously incident on the two photodetection pixels 71 of the channel numbers (2) and (3). In the photodetection pixel group 74 in which the total value is 2, it is determined that the photons are incident only on the photodetection pixel 71 of the channel number (2).

In another example, as illustrated in (d) in FIG. 9, it is assumed that the 4 signal readout circuits 11 respectively corresponding to the 4 photodetection pixel groups 74 output the total values of 0, 14, 0, 2. In this case, in each of the two photodetection pixel groups 74 in which the total value is 0, as illustrated in (e) in FIG. 9, it is determined that no photon is incident on any photodetection pixel 71. In the photodetection pixel group 74 in which the total value is 14, it is determined that the photons are simultaneously incident on the three photodetection pixels 71 of the channel numbers (2), (3) and (4). In the photodetection pixel group 74 in which the total value is 2, it is determined that the photons are incident only on the photodetection pixel 71 of the channel number (2).

Figure 10:
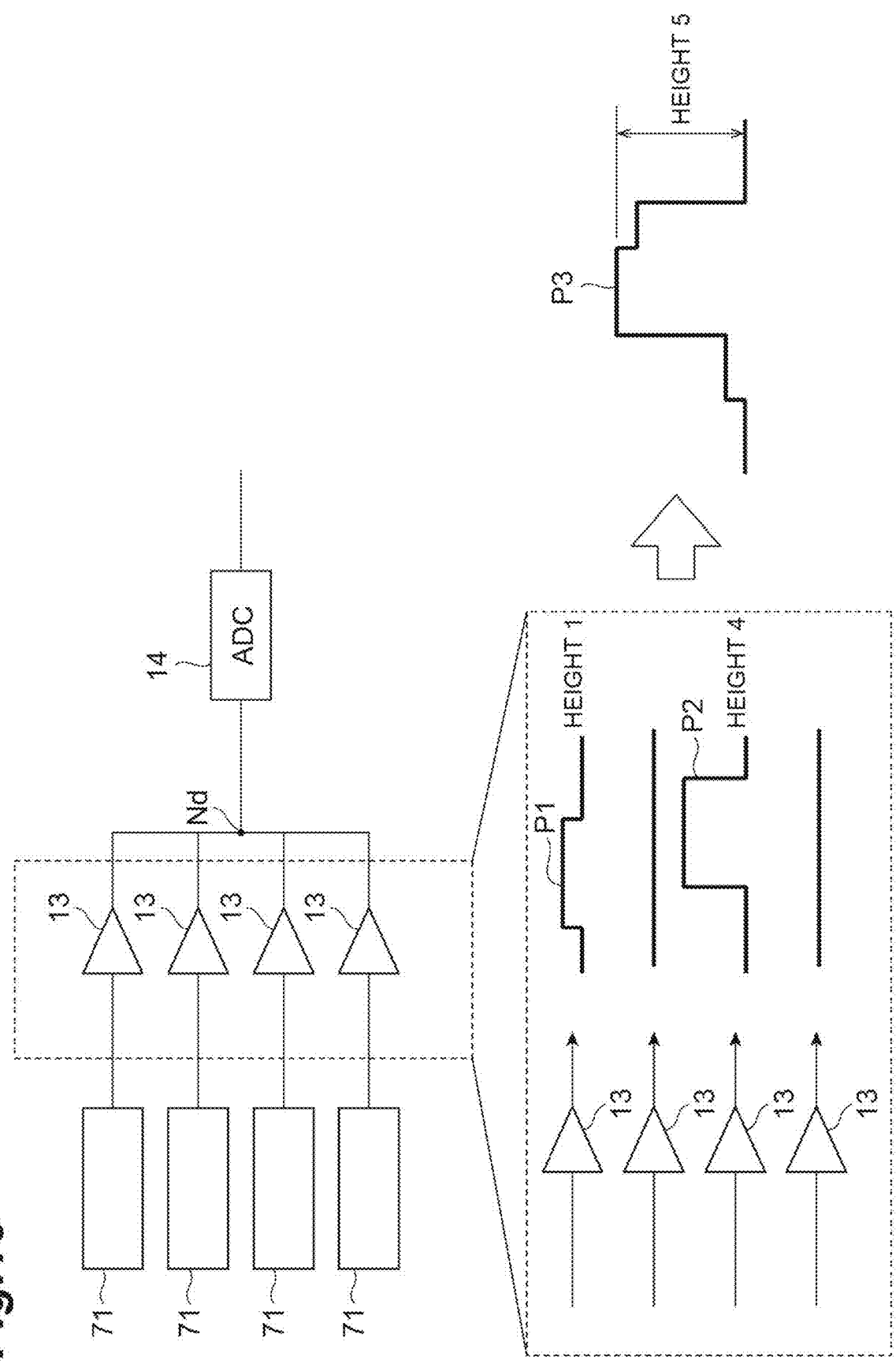
FIG. 10 is a diagram conceptually illustrating an operation example of the signal readout circuit 11.

FIG. 10 is a diagram conceptually illustrating an operation example of the signal readout circuit 11. For example, it is assumed that the photons are substantially simultaneously incident on the two photodetection pixels 71 of the channel numbers (1) and (3). In this case, the light incidence detection unit 13 corresponding to the channel number (1) outputs a pulse signal P1 having a height (voltage value) of 1. Further, the light incidence detection unit 13 corresponding to the channel number (3) outputs a pulse signal P2 having a height (voltage value) of 4. In addition, the heights of the pulse signals P1 and P2 are relative values.

These pulse signals P1 and P2 overlap each other at the node Nd, become a pulse signal P3 having a peak height (maximum voltage value) of 5, and the pulse signal P3 is input to the A/D converter circuit of the total value detection unit 14. The total value detection unit 14 generates a digital signal according to the peak height of the pulse signal P3, and outputs the digital signal to the outside of the signal readout apparatus 10. In addition, as illustrated in FIG. 10, even when the generation timings of the pulse signals P1 and P2 are slightly shifted, the shift is allowed as long as it is equal to or less than time widths of the pulse signals P1 and P2.

The time width of the pulse signal output from the light incidence detection unit 13 affects the response speed of the radiation detector 1A. Therefore, it is desirable that the time width can be arbitrarily set according to the use environment and the required specifications. Further, if the time width of the pulse signal output from the light incidence detection unit 13 is too short with respect to a processing period (processing speed) of the total value detection unit 14, when a plurality of pulse signals are temporally separated, the signal input to the total value detection unit 14 does not become the total value thereof, which may lead to erroneous detection. Therefore, the time width of the pulse signal is preferably set according to the processing period of the total value detection unit 14.

Figure 11:
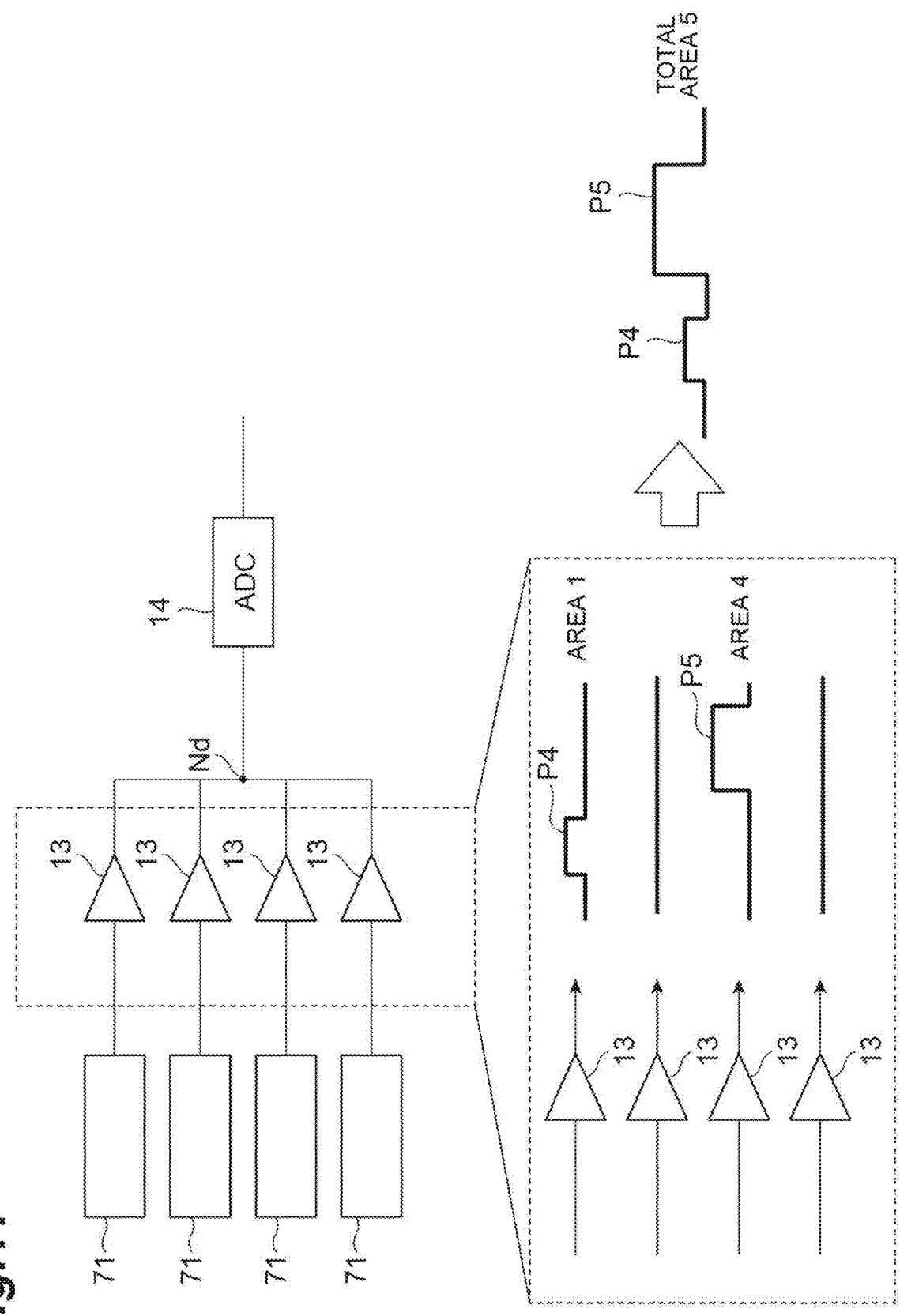
FIG. 11 is a diagram conceptually illustrating another operation example of the signal readout circuit 11.

FIG. 11 is a diagram conceptually illustrating another operation example of the signal readout circuit 11. In this example also, it is assumed that the photons are substantially simultaneously incident on the two photodetection pixels 71 of the channel numbers (1) and (3). In this case, the light incidence detection unit 13 corresponding to the channel number (1) outputs a pulse signal P4 having a pulse area (that is, time integrated value of pulse height, typically, pulse time width×pulse height) of 1. Further, the light incidence detection unit 13 corresponding to the channel number (3) outputs a pulse signal P5 having a pulse area of 4. In addition, the areas of the pulse signals P4 and P5 are relative values.

These pulse signals P4 and P5 are input to the A/D converter circuit of the total value detection unit 14. The total value detection unit 14 generates a digital signal according to the total area of the pulse signals P4 and P5, and outputs the digital signal to the outside of the signal readout apparatus 10. In addition, the total value detection unit 14 generates the digital signal according to the total area of the pulse signals existing in a predetermined processing period, and when the two pulse signals are generated in different processing periods, the detection unit does not sum the areas of the pulse signals and performs A/D conversion at respective timings. That is, as illustrated in FIG. 11, even when the generation timings of the pulse signals P4 and P5 are slightly shifted, when the shift is equal to or less than the processing period of the total value detection unit 14, they are treated as simultaneous incidence.

Figure 12:
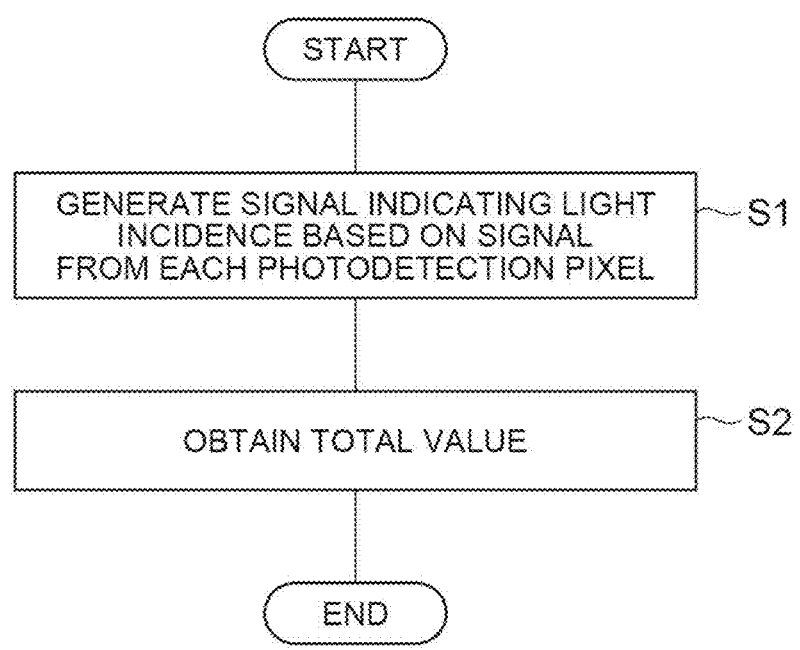
FIG. 12 is a flowchart illustrating a signal readout method according to an embodiment.

FIG. 12 is a flowchart illustrating a signal readout method according to the present embodiment. The signal readout method is a method of reading out the signal from the photodetection element 7 having the plurality of photodetection pixels 71 each generating the detection signal according to light incidence, and may be realized using, for example, the signal readout circuit 11 of the present embodiment.

First, in a first step S1, the N signals each indicating the light incidence are generated respectively based on the signals from the N photodetection pixels 71 included in the photodetection pixel group 74. The first step S1 is performed in, for example, the N light incidence detection units 13. Next, in a second step S2, the total value of the N signals is detected. The second step S2 is performed in, for example, the total value detection unit 14.

Further, in the first step S1, the signal weighted differently corresponding to each photodetection pixel 71 is generated, and the weight thereof is set such that the total value is different for the respective photodetection pixels 71 and all the combination patterns of the photodetection pixels 71 in the photodetection pixel group 74 (see FIG. 8).

Effects obtained by the signal readout apparatus 10, the signal readout circuit 11, and the signal readout method according to the present embodiment described above will be described.

In the signal readout circuit 11 and the signal readout method of the present embodiment, when the signal indicating the light incidence is generated in the light incidence detection unit 13 (first step S1), the different weights are applied to the respective photodetection pixels 71, and the total value of the N weighted signals is detected in the total value detection unit 14 (second step S2). As illustrated in FIG. 8, the weights are set such that the total values are different for the respective photodetection pixels 71 and all the combination patterns of the photodetection pixels 71.

In the above configuration, it is possible to uniquely determine, from the total value, (one or a plurality of) photodetection pixels 71 on which the light is incident. Therefore, according to the above signal readout circuit 11 and the signal readout method, it is possible to distinguish and detect the light even when the light is simultaneously incident on a plurality of positions. Further, it is possible to suppress an increase in circuit scale compared to the case where N signal readout circuits corresponding to N photodetection pixels 71 are provided.

In addition, in the radiation detector disclosed in Patent Document 1, weighting is performed on the output signal from each photodetection pixel. However, since the method of determining the weight value is different from that of the present embodiment, when light is simultaneously incident on a plurality of positions, it is not possible to distinguish and detect the light. The signal readout circuit 11 and the signal readout method of the present embodiment exhibit particular effects that are not in the technique described in Patent Document 1, that is, it is possible to distinguish and detect the light even when the light is simultaneously incident on a plurality of positions.

Further, in the signal readout apparatus 10 of the present embodiment, a large number of photodetection pixels 71 in the photodetection element 7 are divided into the M photodetection pixel groups 74, and the signal readout circuit 11 is provided for each photodetection pixel group 74. Thus, the number N of the light incidence detection units 13 can be reduced compared to the case of using the single signal readout circuit 11. Therefore, the number of all the combination patterns realized by the N photodetection pixels 71 can be prevented from becoming too large. Further, the circuit scale can be reduced to 1/N compared to the case where one signal readout circuit is provided for one photodetection pixel 71.

As in the present embodiment, each light incidence detection unit 13 may include the comparator. In this case, it is possible to accurately determine whether or not the light is incident by setting the threshold value for the detection signal from the photodetection pixel 71. Further, it is possible to easily set the weights such that the total values are different for the respective photodetection pixels 71 and all the combination patterns of the photodetection pixels 71 by making the signal output condition (voltage value or the like) of the comparator different for each comparator.

As in the present embodiment, the output signals from the N light incidence detection units 13 may be analog signals, and the total value detection unit 14 may include an A/D converter circuit for converting the signal obtained by superimposing the output signals from the N light incidence detection units 13 into the digital signal. For example by the above configuration, the total value of the output signals from the N light incidence detection units 13 can be preferably detected.

As in the present embodiment, the weight of the n-th light incidence detection unit 13 (n=1, 2, . . . , N) may be $2^{(n-1)}$. For example by setting the weights as described above, the total values can be made different for the respective photodetection pixels 71 and all the combination patterns of the photodetection pixels 71. In addition, the weight value of the light incidence detection unit 13 is not limited thereto, and various other weight values may be used as long as the total values are different for the respective photodetection pixels 71 and all the combination patterns of the photodetection pixels 71.

(Modification)

Figure 13:
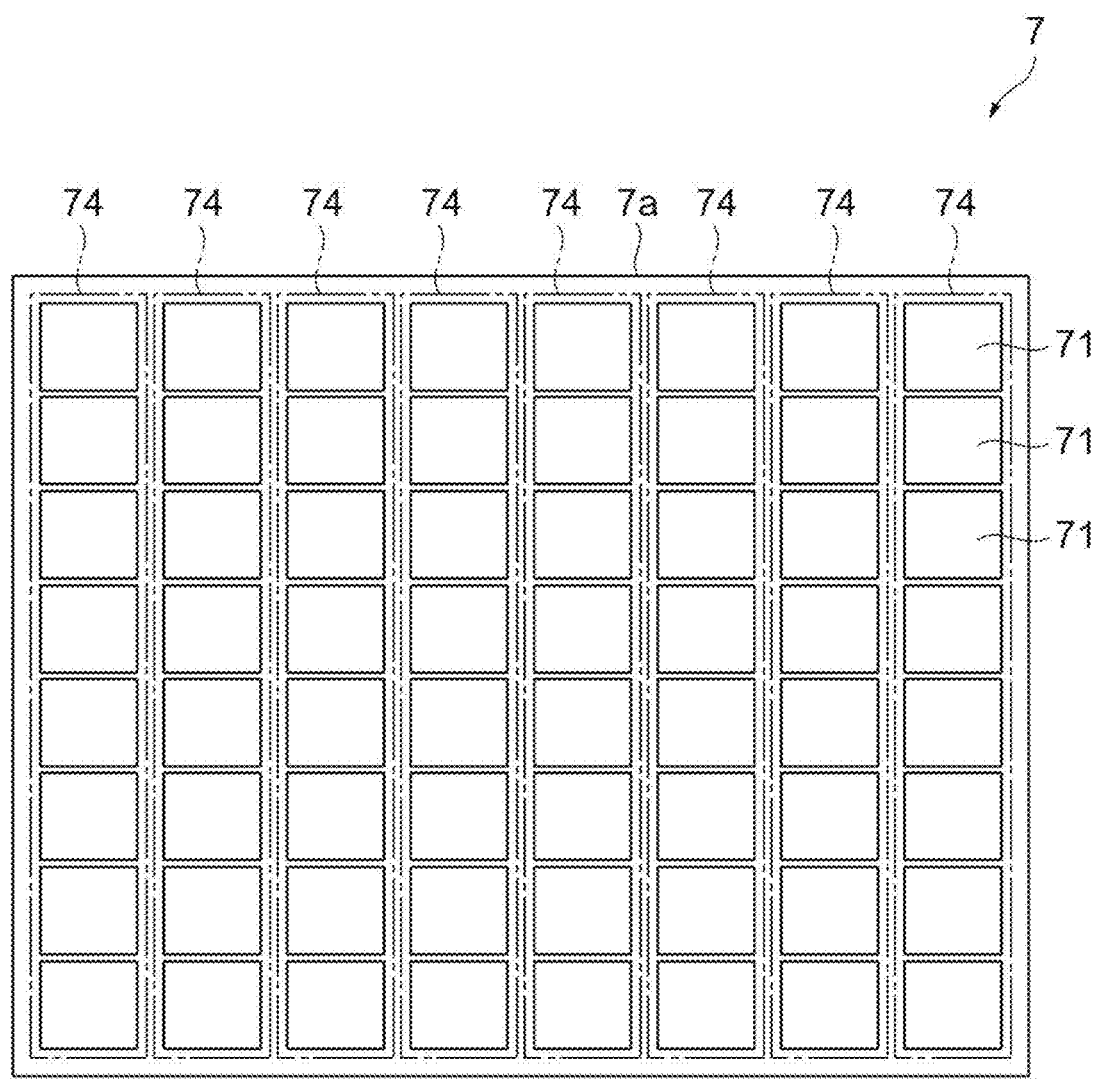
FIG. 13 is a plan view illustrating a modification of the light incident surface 7a of the photodetection element 7.
Figure 14:
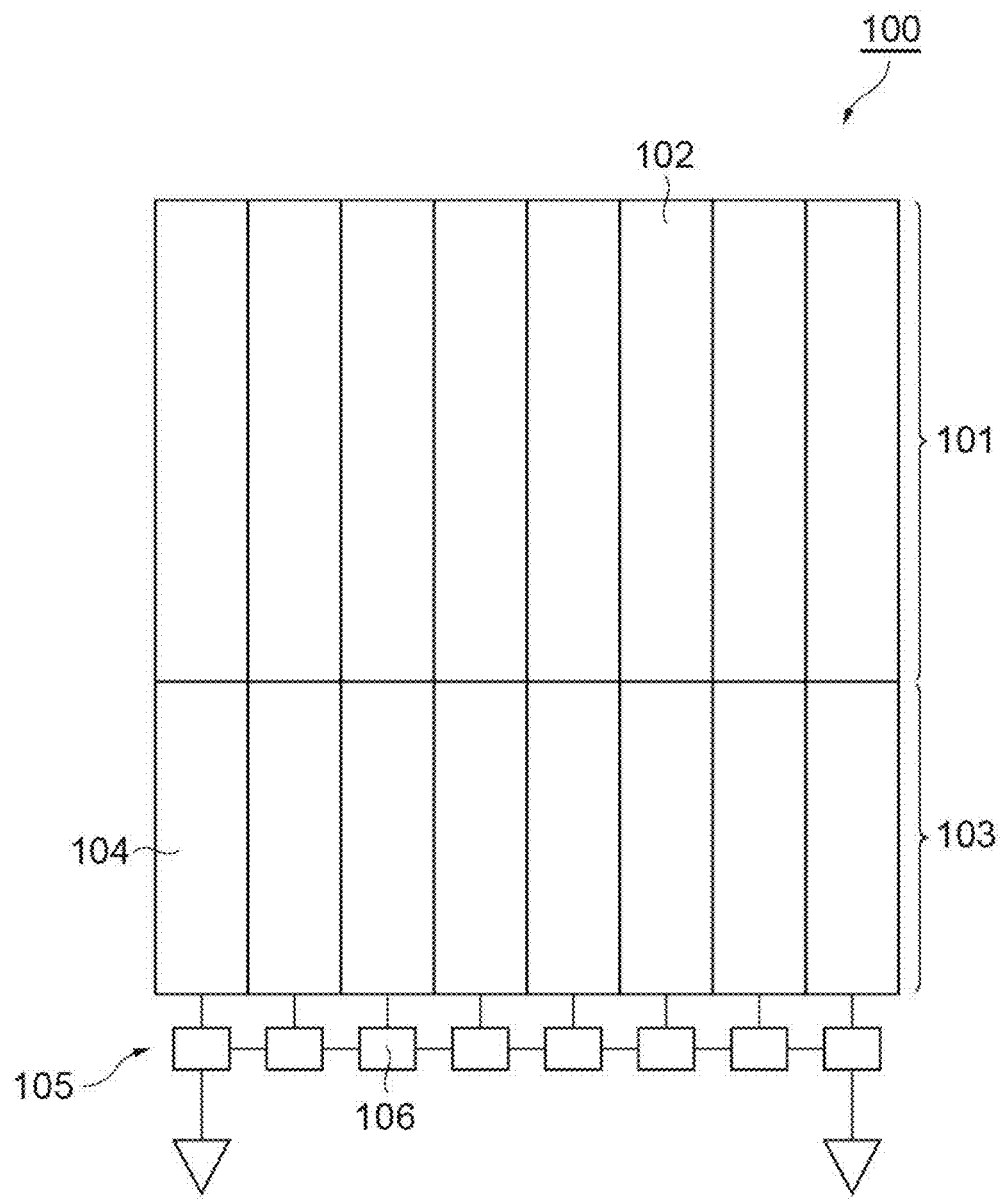
FIG. 14 is a diagram conceptually illustrating a configuration of a radiation detector using a resistor chain.
Figure 15:
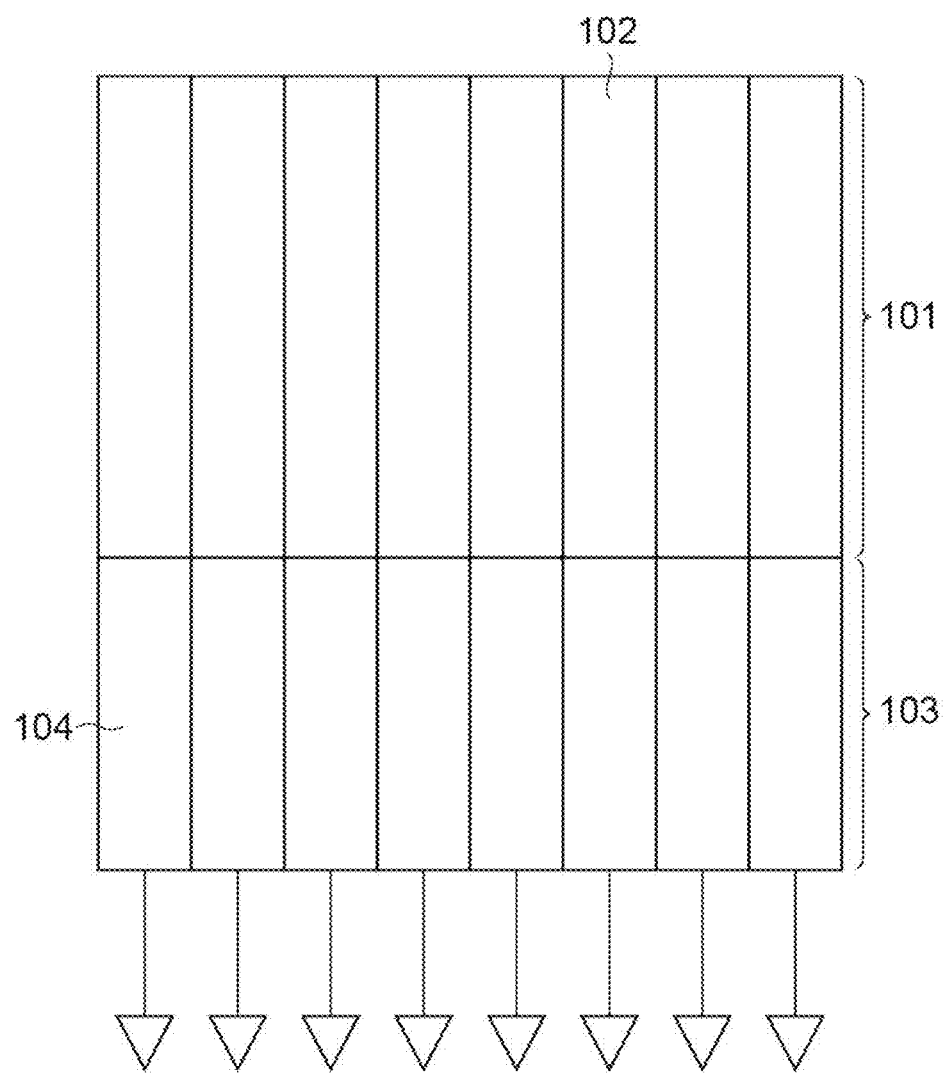
FIG. 15 is a diagram conceptually illustrating a configuration of a radiation detector having a configuration in which readout circuits of the number same as photodetection pixels are provided, and output signals from the respective photodetection pixels are individually read out.

FIG. 13 is a plan view illustrating a modification of the light incident surface 7a of the photodetection element 7. In the case illustrated in FIG. 4 of the above embodiment, the adjacent photodetection pixels 71 of $N_1$ rows×$N_2$ columns are divided into one photodetection pixel group 74, and the number of rows $N_1$ and the number of columns $N_2$ are equal to each other (specifically, $N_1=N_2=2$), and further, as illustrated in FIG. 13, the number of rows $N_1$ and the number of columns $N_2$ may be different from each other. In the example of FIG. 13, in the light incident surface 7a in which the 64 photodetection pixels 71 are arrayed two-dimensionally in 8 rows×8 columns, the number of rows $N_1$ of each photodetection pixel group 74 is set to 8, and the number of columns $N_2$ is set to 1.

Further, for example, at least one of the N photodetection pixels 71 included in one photodetection pixel group 74 may be separated from the other photodetection pixels 71 without being adjacent to the other photodetection pixels. Thus, the division pattern of the photodetection pixel group 74 is arbitrary, and the effects of the above embodiment can be preferably achieved in any division.

The signal readout circuit, the signal readout apparatus, and the signal readout method of the photodetection element are not limited to the embodiment and configuration examples described above, and various modifications are possible.

For example, in the above embodiment, the weighting is performed on the pulse height (voltage value) or the pulse area of the signal output from the light incidence detection unit 13, and further, the weighting may be performed on various other feature values of the signal output from the light incidence detection unit 13.

Further, in the above embodiment, the comparator is used as the light incidence detection unit 13, and the weighted signal is output from the comparator, and further, the configuration of the light incidence detection unit 13 is not limited to this, and for example, a signal of a constant magnitude may be output from each comparator, and weighting may be performed on the output signal from each comparator using various weighting circuits connected to the subsequent stage of the comparator. Further, the light incidence detection unit 13 may be constituted using a logic circuit and a decoder.

The signal readout circuit for the photodetection element of the above embodiment is a circuit for reading out a signal from the photodetection element having a plurality of photodetection pixels each generating a detection signal according to light incidence, and includes N light incidence detection units (N is an integer of 2 or more) each for inputting the detection signal from each of N photodetection pixels included in the plurality of photodetection pixels and outputting a signal indicating the light incidence; and a total value detection unit for detecting a total value of the output signals from the N light incidence detection units, and each light incidence detection unit outputs the signal weighted differently corresponding to each photodetection pixel, and a weight thereof is set such that the total values are different for respective photodetection pixels and all combination patterns of the photodetection pixels in the N photodetection pixels.

The signal readout method for the photodetection element of the above embodiment is a method for reading out a signal from the photodetection element having a plurality of photodetection pixels each generating a detection signal according to light incidence, and includes a first step of generating N signals (N is an integer of 2 or more) each indicating the light incidence based on a signal from each of N photodetection pixels included in the plurality of photodetection pixels; and a second step of detecting a total value of the N signals, and in the first step, the signal weighted differently corresponding to each photodetection pixel is generated, and a weight thereof is set such that the total values are different for respective photodetection pixels and all combination patterns of the photodetection pixels in the N photodetection pixels.

In the above signal readout circuit, each light incidence detection unit may include a comparator. In this case, it is possible to accurately determine whether or not the light is incident by setting a threshold value for the detection signal from the photodetection pixel. Further, it is possible to easily set the weights such that the total values are different from each other for the respective photodetection pixels and all the combination patterns of the photodetection pixels by making the signal output condition (voltage value or the like) of the comparator different for each comparator.

In the above signal readout circuit, the output signals from the N light incidence detection units may be analog signals, and the total value detection unit may include an analog-digital converter circuit for converting a signal obtained by superimposing the output signals from the N light incidence detection units into a digital signal. For example by the above configuration, it is possible to detect the total value of the output signals from the N light incidence detection units.

In the above signal readout circuit, the weight of the n-th light incidence detection unit (n=1, 2, . . . , N) may be $2^{(n-1)}$. For example by setting the weights as described above, the total values can be made different for the respective photodetection pixels and all the combination patterns of the photodetection pixels.

The signal readout apparatus for the photodetection element of the above embodiment is an apparatus for reading out a signal from the photodetection element having M photodetection pixel groups (M is an integer of 2 or more) each including a plurality of photodetection pixels each generating a detection signal according to light incidence, and includes M signal readout circuits each being the signal readout circuit for the photodetection element of the above configuration, and each of the M signal readout circuits reads out the signal from each of the M photodetection pixel groups.

INDUSTRIAL APPLICABILITY

The embodiments can be used as a signal readout circuit, a signal readout apparatus, and a signal readout method for a photodetection element capable of distinguishing and detecting light even when the light is simultaneously incident on a plurality of positions while suppressing an increase in circuit scale.

REFERENCE SIGNS LIST

1A—radiation detector, 5—scintillator array, 7—photodetection element, 7a—light incident surface, 7b—signal output surface, 10—signal readout apparatus, 11—signal readout circuit, 12—input terminal, 13—light incidence detection unit, 14—total value detection unit, 51—scintillator, 71—photodetection pixel, 72—output terminal, 74—photodetection pixel group, 100—radiation detector, 101—scintillator group, 102—scintillator, 103—photodetection element, 104—photodetection pixel, 105—resistor chain, 106—resistor, Nd—node, P1-P5—pulse signal.

The invention claimed is:
1. A signal readout circuit for a photodetection element for reading out a signal from the photodetection element having a plurality of photodetection pixels each generating a detection signal according to light incidence, the circuit comprising:
N light incidence detection units (N is an integer of 2 or more) each configured to input the detection signal from each of N photodetection pixels included in the plurality of photodetection pixels and output a signal indicating the light incidence; and
a total value detection unit configured to detect a total value of the output signals from the N light incidence detection units, wherein
each light incidence detection unit is configured to output the signal weighted differently corresponding to each photodetection pixel, and a weight thereof is set such that the total values are different for respective photodetection pixels and all combination patterns of the photodetection pixels in the N photodetection pixels.

2. The signal readout circuit for the photodetection element according to claim 1, wherein each light incidence detection unit includes a comparator.

3. The signal readout circuit for the photodetection element according to claim 1, wherein the output signals from the N light incidence detection units are analog signals, and the total value detection unit includes an analog-digital converter circuit configured to convert a signal obtained by superimposing the output signals from the N light incidence detection units into a digital signal.

4. The signal readout circuit for the photodetection element according to claim 1, wherein the weight of the n-th light incidence detection unit (n=1, 2, . . . , N) is $2^{(n-1)}$.

5. A signal readout apparatus for a photodetection element for reading out a signal from the photodetection element having M photodetection pixel groups (M is an integer of 2 or more) each including a plurality of photodetection pixels each generating a detection signal according to light incidence, the apparatus comprising:
  M signal readout circuits each being the signal readout circuit for the photodetection element according to claim 1, wherein
  each of the M signal readout circuits is configured to read out the signal from each of the M photodetection pixel groups.

6. A signal readout method for a photodetection element for reading out a signal from the photodetection element having a plurality of photodetection pixels each generating a detection signal according to light incidence, the method comprising:
  generating N signals (N is an integer of 2 or more) each indicating the light incidence based on a signal from each of N photodetection pixels included in the plurality of photodetection pixels; and
  detecting a total value of the N signals, wherein
  in the generating, the signal weighted differently corresponding to each photodetection pixel is generated, and a weight thereof is set such that the total values are different for respective photodetection pixels and all combination patterns of the photodetection pixels in the N photodetection pixels.

* * * * *